(12) United States Patent
Liu et al.

(10) Patent No.: US 9,379,357 B2
(45) Date of Patent: Jun. 28, 2016

(54) ORGANIC LIGHT EMITTING STRUCTURE

(71) Applicant: EverDisplay Optronics (Shanghai) Limited, Shanghai (CN)

(72) Inventors: Chihhung Liu, Shanghai (CN);
Chenghsien Wang, Shanghai (CN);
Chunchieh Huang, Shanghai (CN)

(73) Assignee: EverDisplay Optronics (Shanghai) Limited, Shanghai (CN)

( * ) Notice: Subject to any disclaimer, the term of this patent is extended or adjusted under 35 U.S.C. 154(b) by 232 days.

(21) Appl. No.: 14/104,876

(22) Filed: Dec. 12, 2013

(65) Prior Publication Data

US 2014/0361265 A1 Dec. 11, 2014

(30) Foreign Application Priority Data

Jun. 6, 2013 (CN) .......................... 2013 1 0224799

(51) Int. Cl.
*H01L 51/52* (2006.01)
*H01L 27/32* (2006.01)

(52) U.S. Cl.
CPC ........ *H01L 51/5271* (2013.01); *H01L 51/5218* (2013.01); *H01L 27/3246* (2013.01); *H01L 2251/5315* (2013.01)

(58) Field of Classification Search
None
See application file for complete search history.

(56) References Cited

U.S. PATENT DOCUMENTS

| | | | |
|---|---|---|---|
| 6,650,045 B1 | 11/2003 | Forrest et al. | |
| 2002/0101152 A1* | 8/2002 | Kimura | H01L 51/5271 313/505 |
| 2004/0113550 A1* | 6/2004 | Adachi | H01L 27/3246 313/512 |
| 2009/0174320 A1* | 7/2009 | Kim | H01L 27/3246 313/504 |
| 2010/0135040 A1* | 6/2010 | Adachi | H01L 27/3262 362/623 |
| 2011/0127500 A1* | 6/2011 | Ko | H01L 51/5206 257/40 |
| 2013/0049028 A1* | 2/2013 | Kim | H01L 51/5209 257/88 |
| 2014/0027731 A1* | 1/2014 | Kim | H01L 51/5271 257/40 |

FOREIGN PATENT DOCUMENTS

| | | |
|---|---|---|
| CN | 101958096 A | 1/2011 |
| CN | 101958096 A | 1/2011 |
| CN | 102386338 A | 3/2012 |
| CN | 102891265 A | 1/2013 |
| JP | 2011-228229 A | 11/2011 |
| TW | 200930141 A | 7/2009 |

OTHER PUBLICATIONS

Office Action issued May 28, 2015 by the TW Office.
Office Action issued Mar. 21, 2016 by the CN Office.

* cited by examiner

*Primary Examiner* — Khaja Ahmad
(74) *Attorney, Agent, or Firm* — Yunling Ren; Eaton & Van Winkle

(57) ABSTRACT

The present application discloses an OLED with an improved structure, comprising a reflective anode layer, a transparent cathode layer, an organic light-emitting layer sandwiched between the anode layer and the cathode layer, and a side reflective layer surrounding the organic light-emitting layer and forming a light exiting area together with the anode layer, wherein the light emitted from the light-emitting layer is reflected by both of the anode layer and the side reflective layer, and then leaves from the light exiting area. According to the present disclosure, the lateral light is reflected by the side reflective layer arranged around the organic light-emitting layer, such that the luminescent efficiency of the OLED with said improved structure can be significantly increased.

17 Claims, 2 Drawing Sheets

ORGANIC LIGHT EMITTING STRUCTURE

CROSS-REFERENCE TO RELATED APPLICATIONS

This application claims the priority to and the benefit of Chinese Patent Application No. 201310224799.8, filed on Jun. 6, 2013 and entitled "AN ORGANIC LIGHT EMITTING STRUCTURE", which is incorporated herein by reference in its entirety.

TECHNICAL FIELD

The disclosure relates to a structure of organic light-emitting diode (OLED).

BACKGROUND

OLED is a type of self-luminous display. The luminescent efficiency of OLED is mainly dependent on the luminescent materials, the substrate and configuration of peripheral elements. Typically, OLED comprises a reflective layer to reflect the light emitted by the luminescent layer, which increases the luminescent brightness and the display performance.

FIG. 1 is a schematic view showing the structure of OLED in the related art. The anode of the OLED is configured with a reflective layer to reflect the light emitted by the organic light-emitting layer. The reflective layer can be a anode metal plane. As shown in FIG. 1, although the OLED comprises the reflective layer, some of the light emitted is still randomly diffused and can not transmitted through the effective emission area and the effective emission direction. Accordingly, the luminescent efficiency is affected due to the loss of light.

SUMMARY

According to one aspect of the disclosure, an OLED is provided, comprising:
a reflective anode layer,
a transparent cathode layer,
an organic light-emitting layer, sandwiched between the anode layer and the cathode layer, and
a side reflective layer, surrounding the organic light-emitting layer and forming a light exiting area together with the anode layer,
wherein the anode layer and the side reflective layer are capable of reflecting light emitted from the light-emitting layer such that the light leaves from the light exiting area.

According to some embodiments, wherein the side reflective layer is formed by physical or chemical vapor deposition.

According to some embodiments, the side reflective layer comprises a reflective metal layer.

According to some embodiments, the side reflective layer has a three-layer laminated structure, which comprises two outer layers of transparent metal oxide layers with semiconductor characteristic and the reflective metal layer between the two outer layers.

According to some embodiments, the side reflective layer is formed with a transparent metal oxide layer of semiconductor characteristic and the reflective metal layer.

According to some embodiments, the metal oxide layer is made of ITO or IZO.

According to some embodiments, the reflective metal layer is made of Al, Ag, Ni or alloy thereof.

According to some embodiments, the angle between the side reflective layer and the anode layer ranges from 90° to 150°.

According to some embodiments, the shortest distance between the side reflective layer and the organic light-emitting layer is greater than or equal to two times of the shortest distance between the cathode layer and the anode layer.

According to other aspect of the disclosure, an OLED is provided, comprising:
a reflective cathode layer,
a transparent anode layer,
an organic light-emitting layer, sandwiched between the cathode layer and the anode layer, and
a side reflective layer, surrounding the organic light-emitting layer and forming a light exiting area together with the cathode layer,
wherein the cathode layer and the side reflective layer are capable of reflecting light emitted from the organic light-emitting layer such that the light leaves from the light exiting area.

According to the present disclosure, the lateral light is reflected by the side reflective layer arranged around the organic light-emitting layer, such that the luminescent efficiency of the OLED with said structure can be significantly increased.

DETAILED DESCRIPTION

Figure 1:
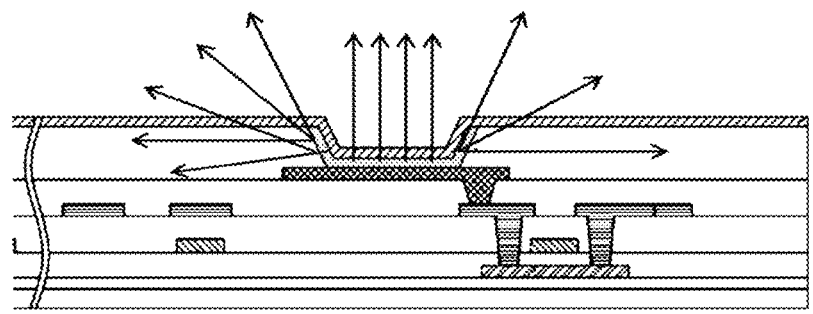
FIG. 1 is a schematic view showing the structure of conventional OLED in the related art.

Exemplary embodiments of the disclosure will now be described more fully with reference to the accompanying drawings, in which exemplary embodiments are shown. Exemplary embodiments of the disclosure may, however, be embodied in many different forms and should not be construed as being limited to the embodiments set forth herein; rather, these embodiments are provided so that this disclosure will be thorough and complete, and will fully convey the concept of exemplary embodiments to those skilled in the art. In the drawings, the thicknesses of layers and areas are exaggerated for clarity. Like reference numerals in the drawings denote like elements, and thus their description will be omitted.

The described features, structures, or/and characteristics of the disclosure may be combined in any suitable manner in one or more embodiments. In the following description, numerous specific details are disclosed to provide a thorough understanding of embodiments of the disclosure. One skilled in the relevant art will recognize, however, that the disclosure may be practiced without one or more of the specific details, or with other methods, components, materials, and so forth. In other instances, well-known structures, materials, or operations are not shown or described in detail to avoid obscuring aspects of the disclosure.

Provided herein is an OLED with high luminescent efficiency which comprises a cathode layer 1, an anode layer 2, an organic light-emitting layer 3 sandwiched between the cathode layer 1 and the anode layer 2, and a side reflective layer 4.

Figure 2:
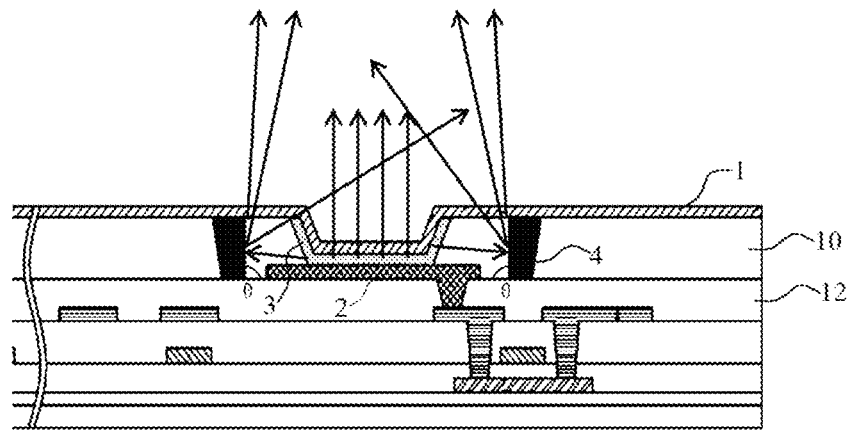
FIG. 2 is a schematic view showing the structure of OLED according to one example of the present disclosure.

Referring to FIG. 2, in one embodiment, the reflective anode layer 2 may reflect the light emitted from the organic light-emitting layer 3. The cathode layer 1 is a transparent layer. The organic light-emitting layer 3 is sandwiched between the cathode layer 1 and the anode layer 2. When a suitable voltage is applied between the cathode layer 1 and the anode layer 2, electrons and holes will encounter and recombine in the organic light-emitting layer 3, emitting light. The light emitted is reflected by the reflective layer of the anode and then leaves from the transparent cathode layer.

The anode layer 2 comprises a metal layer with high reflectivity. The metal layer can be a high-reflective smooth flat layer made from Al, Ag, Ni or alloy thereof. The anode layer can also be a bi-layer structure or a sandwich structure. For example, the upper layer and lower layer of the anode can be a metal oxide layer made from ITO and/or IZO or the like. The middle layer between the upper layer and lower layer of the anode functions as the reflective layer and can be made from Al, Ag, Ni or alloy thereof.

A side reflective layer 4 is further arranged around the organic light-emitting layer 3 and can be formed by physical or chemical vapor deposition. The side reflective layer 4 may also comprises a metal layer for reflecting the light, similar to the metal layer of the anode, and can also be designed to have a sandwich structure, among which two outer layers are transparent metal oxide layers with semiconductor characteristics such as ITO and/or IZO, and the middle layer between the two outer layers is a reflective metal layer. Alternatively, the layer 4 can also be a single-layer structure made of metal or a bi-layer structure including a transparent metal oxide layer and a metal layer. The side reflective layer 4 which is disposed under the cathode layer 1 forms a light exiting area together with the anode layer 2. All the light emitted from the organic light-emitting layer 3 leaves through this area.

The height of the side reflective layer 4 can be adjusted so as to control the side transmittance of the OLED structure. Alternatively, the distance between the side reflective layer 4 and the anode layer 2 can be adjusted to control the dimension of the light exiting area. Alternatively, the angle between the side reflective layer 4 and the plane of the anode layer 2 can be adjusted to control the angle of the light exiting area.

Figure 4:
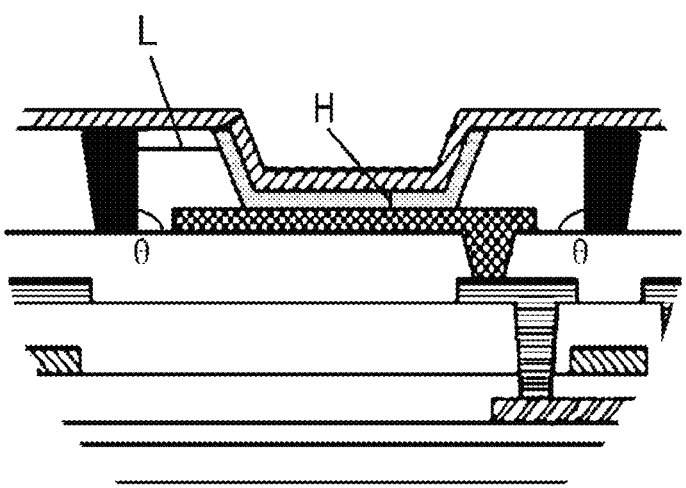
FIG. 4 is a partially enlarged view showing the structure of OLED according to the present disclosure.

Further, the side reflective layer 4 may keep a certain distance from the organic light-emitting layer 3 for electrical protection. Referring to FIG. 4, the shortest distance between the side reflective layer 4 and the organic light-emitting layer 3 is defined as L, and the shortest distance between the cathode layer 1 and the anode layer 2 is defined as H, wherein L should be greater than or equal to two times of H, to prevent the OLED from blowing out due to the occurrence of the charge induction. For example, the shortest distance between the side reflective layer 4 and the organic light-emitting layer 3 can be designed to be about 0.6 µm, and even can be 0.6-7 µm, since the evaporation of the OLED currently has a precision up to ±7 µm.

Figure 3:
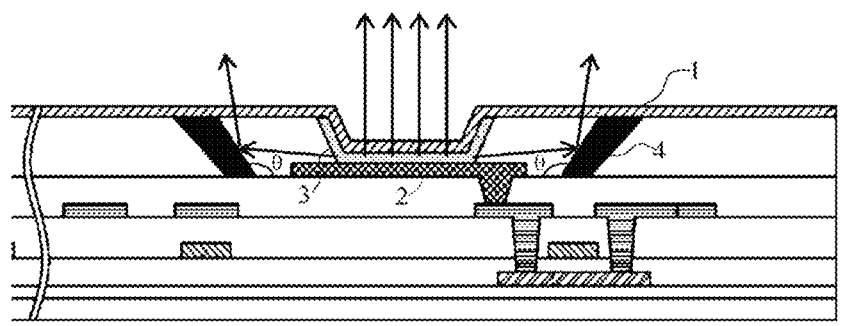
FIG. 3 is a schematic view showing the structure of OLED according to another example of the present disclosure.

According to one example of the present disclosure, the side reflective layer 4 is designed to have a shape as shown in FIGS. 2 and 3, to increase the reflection efficiency thereof. The angle θ between the side reflective layer 4 and the anode layer 2 can be suitably designed to be 90°-150°. The angle θ can be designed according to the practical requirements, so that the diffusion light along the horizontal direction emitted from the OLED can be guided to the visual area, and thus increasing the brightness. It will be readily understood that the side reflective layer 4 can be designed to be curved surface of other shape according to the practical requirements, to achieve different reflection effects as desired.

The formation method of the side reflective layer 4 will be described as follows.

The anode layer 2 is formed on the planarization layer 10, followed by forming an insulating layer 12 covering the anode layer 2 thereon. The insulating layer 12 is formed with an opening for forming the side reflective layer 4 therein. A reflective material layer is deposited on the surface of the insulating layer 12 as well as in the opening of the insulating layer 12 by PVD or CVD. The reflective material layer is subjected to etching with etch back process to form the side reflective layer 4 in the opening. The insulating material is deposited to cover the upper surface of the side reflective layer 4. Next, an opening through which the anode 2 is exposed is formed by etching the insulating material. The organic light-emitting layer 3 is deposited in the opening, and the cathode layer is subsequently deposited on the organic light-emitting layer 3. The remaining procedures are conventional processes as known by the persons skilled in the art, and then will not be described in detail herein.

It should be noted that the above embodiments are illustrated by using the anode layer 2 as the reflective layer and the cathode layer 1 as the transparent layer. With respect to OLEDs with other structures, for example, in which the cathode layer 1 is reflective and the anode is transparent, the side reflective layer according to the present disclosure also can be disposed surrounding the organic light-emitting layer thereof, to increasing the luminescent efficiency. The present disclosure can be applied to various OLEDs, and the technical effects of the present disclosure will not be affected.

According to the present disclosure, the lateral light is reflected by the side reflective layer arranged around the organic light-emitting layer, such that the luminescent efficiency of the OLED with said structure can be significantly increased.

Although the present disclosure has been described and illustrated in detail, it is clearly understood that the same is by way of illustration and example only and is not to be taken by way of limitation, the spirit and scope of the present disclosure being limited only by the terms of the appended claims.

What is claimed is:

1. An organic light emitting structure, comprising:
   a reflective anode layer,
   a transparent cathode layer,
   an organic light-emitting layer, sandwiched between the reflective anode layer and the transparent cathode layer, and
   a side reflective layer, embedded in a planarization layer which extends from a bottom surface of the reflective anode layer and to a bottom surface of the transparent cathode layer,
   surrounding the organic light-emitting layer and forming a light exiting area together with the reflective anode layer such that light exits from the light exiting area after being reflected by the reflective anode layer and the side reflective layer,
   wherein the side reflective layer keeps a certain distance from the reflective anode layer and the organic light-emitting layer for electrical protection, and the side reflective layer is disposed directly under the transparent cathode layer.

2. The organic light emitting structure according to claim 1, wherein the side reflective layer is formed by physical or chemical vapor deposition.

3. The organic light emitting structure according to claim 1, wherein the side reflective layer comprises a reflective metal layer.

4. The organic light emitting structure according to claim 3, wherein the side reflective layer comprises a three-layer laminated structure, which comprises two outer layers of transparent metal oxide layers with semiconductor characteristic and the reflective metal layer between the two outer layers.

5. The organic light emitting structure according to claim 3, wherein the side reflective layer is formed with a transparent metal oxide layer of semiconductor characteristic and the reflective metal layer.

6. The organic light emitting structure according to claim 4, wherein the metal oxide layer is made of ITO or IZO.

7. The organic light emitting structure according to claim 5, wherein the metal oxide layer is made of ITO or IZO.

8. The organic light emitting structure according to claim 3, wherein the reflective metal layer is made of Al, Ag, Ni or alloy thereof.

9. The organic light emitting structure according to claim 1, wherein the shortest distance between the side reflective layer and the organic light-emitting layer is greater than or equal to two times of the shortest distance between the transparent cathode layer and the reflective anode layer.

10. The organic light emitting structure according to claim 1, wherein the angle between the side reflective layer and the reflective anode layer ranges from 90° to 150°.

11. An organic light emitting structure, comprising:
a reflective cathode layer,
a transparent anode layer,
an organic light-emitting layer, sandwiched between the reflective cathode layer and the transparent anode layer, and
a side reflective layer, embedded in a planarization layer which extends from a bottom surface of the transparent anode layer and to a bottom surface of the reflective cathode layer,
surrounding the organic light-emitting layer and forming a light exiting area together with the reflective cathode layer, such that light exits from the light exiting area after being reflected by the reflective cathode layer and the side reflective layer,
wherein the side reflective layer keeps a certain distance from the transparent anode layer and the organic light-emitting layer for electrical protection, and the side reflective layer is disposed directly under the reflective cathode layer.

12. The organic light emitting structure according to claim 11, wherein the side reflective layer is formed by physical or chemical vapor deposition.

13. The organic light emitting structure according to claim 11, wherein the side reflective layer comprises a reflective metal layer.

14. The organic light emitting structure according to claim 13, wherein the side reflective layer comprises a three-layer laminated structure, which comprises two outer layers of transparent metal oxide layers with semiconductor characteristic and the reflective metal layer between the two outer layers.

15. The organic light emitting structure according to claim 13, wherein the side reflective layer is formed with a transparent metal oxide layer of semiconductor characteristic and the reflective metal layer.

16. The organic light emitting structure according to claim 11, wherein the shortest distance between the side reflective layer and the organic light-emitting layer is greater than or equal to two times of the shortest distance between the reflective cathode layer and the transparent anode layer.

17. The organic light emitting structure according to claim 11, wherein the angle between the side reflective layer and the reflective cathode layer ranges from 90° to 150°.

* * * * *